(12) United States Patent
Wakita

(10) Patent No.: US 8,520,394 B2
(45) Date of Patent: Aug. 27, 2013

(54) CONTROL DEVICE

(75) Inventor: Yasuyuki Wakita, Kashihara (JP)

(73) Assignee: JTEKT Corporation, Osaka (JP)

( * ) Notice: Subject to any disclaimer, the term of this patent is extended or adjusted under 35 U.S.C. 154(b) by 225 days.

(21) Appl. No.: 13/176,373

(22) Filed: Jul. 5, 2011

(65) Prior Publication Data

US 2012/0014070 A1 Jan. 19, 2012

(30) Foreign Application Priority Data

Jul. 14, 2010 (JP) ................. 2010-159736

(51) Int. Cl.
| | |
|---|---|
| H05K 7/20 | (2006.01) |
| H05K 7/00 | (2006.01) |
| B62D 5/04 | (2006.01) |

(52) U.S. Cl.
USPC ........... 361/720; 361/709; 361/715; 361/719; 361/722; 361/748; 361/752; 165/80.2; 165/80.3; 165/104.33; 165/185; 257/712; 257/713; 257/721; 257/722; 318/139; 318/280; 318/293; 318/432; 318/434; 310/71; 310/79; 310/89; 310/68 B; 174/250; 174/252; 174/261; 174/16.3; 29/592.1; 180/443; 180/444; 180/446

(58) Field of Classification Search
USPC ................. 361/704–712, 715–724, 732, 740, 361/748, 762–767, 784, 785, 796, 797; 165/80.2, 80.3, 80.4, 104.33, 185; 257/706–727, 686, 688, 696; 174/15.1, 174/16.3, 250–267; 318/139, 245, 254, 280, 318/287, 293, 430–479, 727; 310/68 B, 310/68 R, 67 R, 71, 75 R, 79, 89, 91, 64; 180/444, 443, 446; 29/825–852, 592.1
See application file for complete search history.

(56) References Cited

U.S. PATENT DOCUMENTS

| | | | | |
|---|---|---|---|---|
| 5,355,315 | A * | 10/1994 | Daido et al. ................. | 701/41 |
| 5,482,128 | A * | 1/1996 | Takaoka et al. ............. | 180/444 |
| 5,602,451 | A * | 2/1997 | Kohge et al. ................ | 318/293 |
| 5,732,790 | A * | 3/1998 | Endo et al. .................. | 180/444 |
| 5,785,145 | A * | 7/1998 | Wakao et al. ............... | 180/443 |
| 5,844,386 | A * | 12/1998 | Matsuoka et al. ........... | 318/293 |
| 6,078,155 | A * | 6/2000 | Tominaga et al. .......... | 318/293 |
| 6,099,325 | A * | 8/2000 | Parkhill ..................... | 439/76.1 |

(Continued)

FOREIGN PATENT DOCUMENTS

| | | |
|---|---|---|
| JP | A-6-196839 | 7/1994 |
| JP | 02003182606 A * | 7/2003 |
| JP | A-2008-192800 | 8/2008 |
| JP | 02009113609 A * | 5/2009 |

OTHER PUBLICATIONS

Extended European Search Report issued in European Application No. 11173555.1 on Nov. 22, 2011.

Primary Examiner — Michail V Datskovskiy
(74) Attorney, Agent, or Firm — Oliff & Berridge, PLC

(57) ABSTRACT

A circuit board unit of an ECU has an upper surface on which semiconductor elements are installed, a lower surface that is on the opposite side of the circuit board unit from the upper surface, and a cutout portion that is formed below the upper surface. A power module includes a conductive protruding piece and an electrically insulating main portion that holds the protruding piece. The conductive protruding piece is inserted in the cutout portion to support the circuit board unit, and is electrically connected to the semiconductor elements.

5 Claims, 10 Drawing Sheets

(56) References Cited

U.S. PATENT DOCUMENTS

| | | | |
|---|---|---|---|
| 6,519,152 B1 | 2/2003 | Birger | |
| 6,548,972 B2 * | 4/2003 | Takagi | 318/293 |
| 6,577,030 B2 * | 6/2003 | Tominaga et al. | 310/68 B |
| 6,707,182 B2 * | 3/2004 | Yamanaka et al. | 310/67 R |
| 6,838,844 B2 * | 1/2005 | Shimizu et al. | 318/287 |
| 6,906,483 B2 * | 6/2005 | Tominaga et al. | 318/293 |
| 6,972,959 B2 * | 12/2005 | Asai et al. | 361/719 |
| 6,973,992 B2 * | 12/2005 | Yoneda et al. | 180/446 |
| 6,989,616 B2 * | 1/2006 | Okubo et al. | 310/64 |
| 7,021,418 B2 * | 4/2006 | Tominaga et al. | 180/444 |
| 7,099,155 B2 * | 8/2006 | Kobayashi et al. | 361/719 |
| 7,375,966 B2 * | 5/2008 | Murakami et al. | 361/707 |
| 7,445,081 B2 * | 11/2008 | Tominaga | 180/444 |
| 7,488,184 B2 * | 2/2009 | Yasuda et al. | 439/76.1 |
| 7,635,046 B2 * | 12/2009 | Tominaga et al. | 180/444 |
| 7,751,193 B2 * | 7/2010 | Tominaga et al. | 361/715 |
| 7,989,997 B2 * | 8/2011 | Hashimoto et al. | 310/68 D |
| 8,002,076 B2 * | 8/2011 | Yoshinari et al. | 180/444 |
| 8,102,138 B2 * | 1/2012 | Sekine et al. | 318/646 |
| 8,339,801 B2 * | 12/2012 | Tominaga et al. | 361/775 |
| 8,363,420 B2 * | 1/2013 | Tominaga et al. | 361/775 |
| 2001/0021103 A1 * | 9/2001 | Takagi | 361/752 |
| 2003/0056965 A1 * | 3/2003 | Tsuchiyama | 174/52.1 |
| 2004/0136162 A1 | 7/2004 | Asai et al. | |
| 2007/0007070 A1 * | 1/2007 | Sakata et al. | 180/444 |
| 2007/0045037 A1 * | 3/2007 | Yoshinari et al. | 180/444 |
| 2008/0186689 A1 | 8/2008 | Koizumi | |
| 2008/0277189 A1 * | 11/2008 | Kanda et al. | 180/443 |
| 2009/0040732 A1 | 2/2009 | Yang et al. | |
| 2009/0120712 A1 * | 5/2009 | Kashimoto et al. | 180/444 |
| 2009/0176402 A1 * | 7/2009 | Honda | 439/377 |
| 2009/0295325 A1 * | 12/2009 | Sekine et al. | 318/646 |
| 2010/0049403 A1 * | 2/2010 | Gillman et al. | 701/43 |
| 2010/0052449 A1 * | 3/2010 | Hashimoto et al. | 310/91 |
| 2010/0319976 A1 * | 12/2010 | Nakai et al. | 174/261 |

\* cited by examiner

CONTROL DEVICE

INCORPORATION BY REFERENCE

The disclosure of Japanese Patent Application No. 2010-159736 filed on Jul. 14, 2010 including the specification, drawings and abstract, is incorporated herein by reference in its entirety.

BACKGROUND OF THE INVENTION

1. Field of the Invention

The invention relates to a control device.

2. Description of Related Art

A control device for an electric motor includes a circuit board. Electrical elements such as semiconductors are installed on the circuit board. A conductive connecting member is used to connect the circuit board to another board, or the like. According to Japanese Patent Application Publication No. 6-196839 (JP-A-6-196839), a lead terminal is used as the connecting member. The lead terminal is fixed to a back surface of the circuit board. Electrical elements are installed on a main surface of the circuit board. According to Japanese Patent Application Publication No. 2008-192800 (JP-A-2008-192800), a fitting, called a connecting fitting, is used as a connecting member. The connecting fitting is connected to a back surface of a circuit board. Electrical elements are installed on a main surface of the circuit board.

A connecting member, such as a bonding wire, that electrically connects a circuit board to another member may be arranged on a main surface (installation surface) of the circuit board, on which electrical elements are installed. In this case, on the installation surface of the circuit board, a space for fixation of the connecting member needs to be ensured, and therefore an installation space for the electrical elements reduces accordingly. If there is a plurality of connecting members, an installation space for the electrical elements becomes significantly small.

If the size of the circuit board is increased just to ensure an installation space for the electrical elements, the size of a control device also increases. Even if the connecting member is fixed to the circuit board so as to extend from a back surface of the circuit board as described in JP-A-6496839 and JP-A-2008-192800, the thickness of a control device increases, which leads to an increase in the size of the control device.

SUMMARY OF THE INVENTION

It is an object of invention to provide a control device having a configuration that ensures a larger installation space for electrical elements while minimizing upsizing.

An aspect of the invention relates to a control device including: a circuit board unit that has an upper surface on which an electrical element is installed, a lower surface that is on the opposite side of the circuit board unit from the upper surface, and a cutout portion that is formed below the upper surface; and a module that includes a conductive connecting member having a supporting portion and an electrically insulating main portion that holds the connecting member. The supporting portion is inserted in the cutout portion to support the circuit board unit, and is electrically connected to the electrical element.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
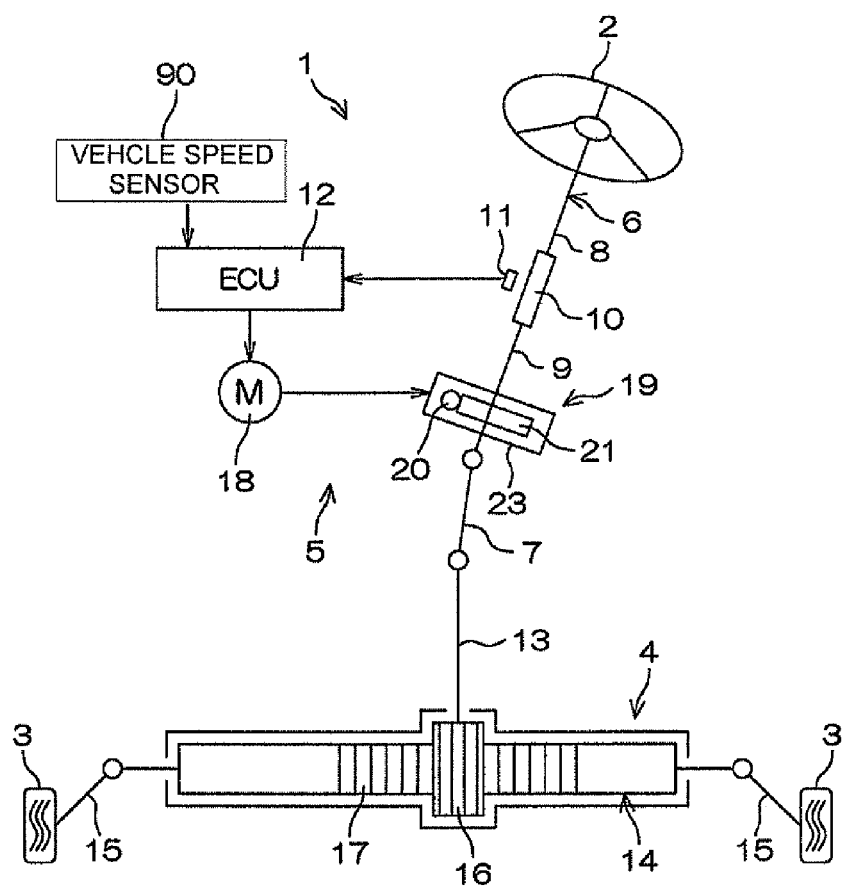
FIG. 1 is a diagram that shows the schematic configuration of an electric power steering system according to an embodiment of the invention.

Hereinafter, an embodiment of the invention will be described in detail with reference to the accompanying drawings. FIG. 1 is a diagram that shows the schematic configuration of an electric power steering system 1 according to the embodiment of the invention. As shown in FIG. 1, the electric power steering system 1 includes a steering wheel 2, a steering mechanism 4 and a steering assist mechanism 5. The steering wheel 2 serves as a steering member. The steering mechanism 4 steers steered wheels 3 in accordance with the rotation of the steering wheel 2. The steering assist mechanism 5 is used to assist a driver in performing a steering operation. The steering wheel 2 is mechanically coupled to the steering mechanism 4 via a steering shaft 6 and an intermediate shaft 7.

In the present embodiment, the description will be made on the basis of an example in which the steering assist mechanism 5 applies an assist force (steering assist force) to the steering shaft 6. The invention may be applied to a structure in which the steering assist mechanism 5 applies an assist force to a pinion shaft 13 (described later) or a structure in which the steering assist mechanism 5 applies an assist force to a rack shaft 14 (described later). The steering shaft 6 has an input shaft 8 and an output shaft 9. The input shaft 8 is coupled to the steering wheel 2. The output shaft 9 is coupled to the intermediate shaft 7. The input shaft 8 and the output shaft 9 are coupled to each other, via a torsion bar 10, so as to be rotatable relative to each other on the same axis.

A torque sensor 11 is arranged around the steering shaft 6. The torque sensor 11 detects a steering torque applied to the steering wheel 2 on the basis of the amount of relative rotational displacement between the input shaft 8 and the output shaft 9. The steering torque detected by the torque sensor 11 is input into an electronic control unit (ECU) 12 that serves as a control device. In addition, a vehicle speed detected by a vehicle speed sensor 90 is input into the ECU 12. The intermediate shaft 7 couples the steering shaft 6 to the steering mechanism 4.

The steering mechanism 4 has a rack and pinion mechanism that includes the pinion shaft 13 and the rack shaft 14 that serves as a steered shaft. Each steered wheel 3 is coupled to a corresponding one of the end portions of the rack shaft 14 via a tie rod 15 and a knuckle arm (not shown). The pinion shaft 13 is coupled to the intermediate shaft 7. The pinion shaft 13 rotates in accordance with a steering operation of the steering wheel 2. A pinion 16 is formed at an end (lower end in FIG. 1) of the pinion shaft 13.

The rack shaft 14 extends linearly along a lateral direction of an automobile. A rack 17 that is in mesh with the pinion 16 is formed in an axially intermediate portion of the rack shaft 14. The pinion 16 and the rack 17 convert the rotation of the pinion shaft 13 into the movement of the rack shaft 14 in an axial direction. By moving the rack shaft 14 in the axial direction, the steered wheels 3 are steered.

When the steering wheel 2 is steered (rotated), the rotation is transmitted to the pinion shaft 13 via the steering shaft 6 and the intermediate shaft 7. Then, the rotation of the pinion shaft 13 is converted into the movement of the rack shaft 14 in the axial direction by the pinion 16 and the rack 17. Thus, the steered wheels 3 are steered. The steering assist mechanism 5 includes an electric motor 18 for steering assistance and a speed reduction mechanism 19 that serves as a reduction gear and is used to transmit the output torque from the electric motor 18 to the steering mechanism 4. The speed reduction mechanism 19 includes a worm shaft 20 and a worm wheel 21. The worm shaft 20 serves as a drive gear (input shaft) into which the driving force from the electric motor 18 is input. The worm wheel 21 serves as a driven gear, and is in mesh with the worm shaft 20. The speed reduction mechanism 19 is accommodated in a gear housing 23.

The worm shaft 20 is coupled to an output shaft (not shown) of the electric motor 18 via a joint (not shown). The worm shaft 20 is rotationally driven by the electric motor 18. The worm wheel 21 and the steering shaft 6 coupled to each other so as to be rotatable together with each other. As the electric motor 18 rotationally drives the worm shaft 20, the worm wheel 21 is rotationally driven by the worm shaft 20 and then the worm wheel 21 and the steering shaft 6 rotate together with each other. Thus, a steering assist force is transmitted to the steering shaft 6.

The electric motor 18 is controlled by the ECU 12. The ECU 12 controls the electric motor 18 on the basis of the steering torque detected by the torque sensor 11, the vehicle speed detected by the vehicle speed sensor 90, and the like. Specifically, the ECU 12 determines a target assist amount using a map that stores the correlation between a torque and a target assist amount for each vehicle speed, and then executes control such that an assist force generated by the electric motor 18 approaches the target assist amount.

Figure 2:
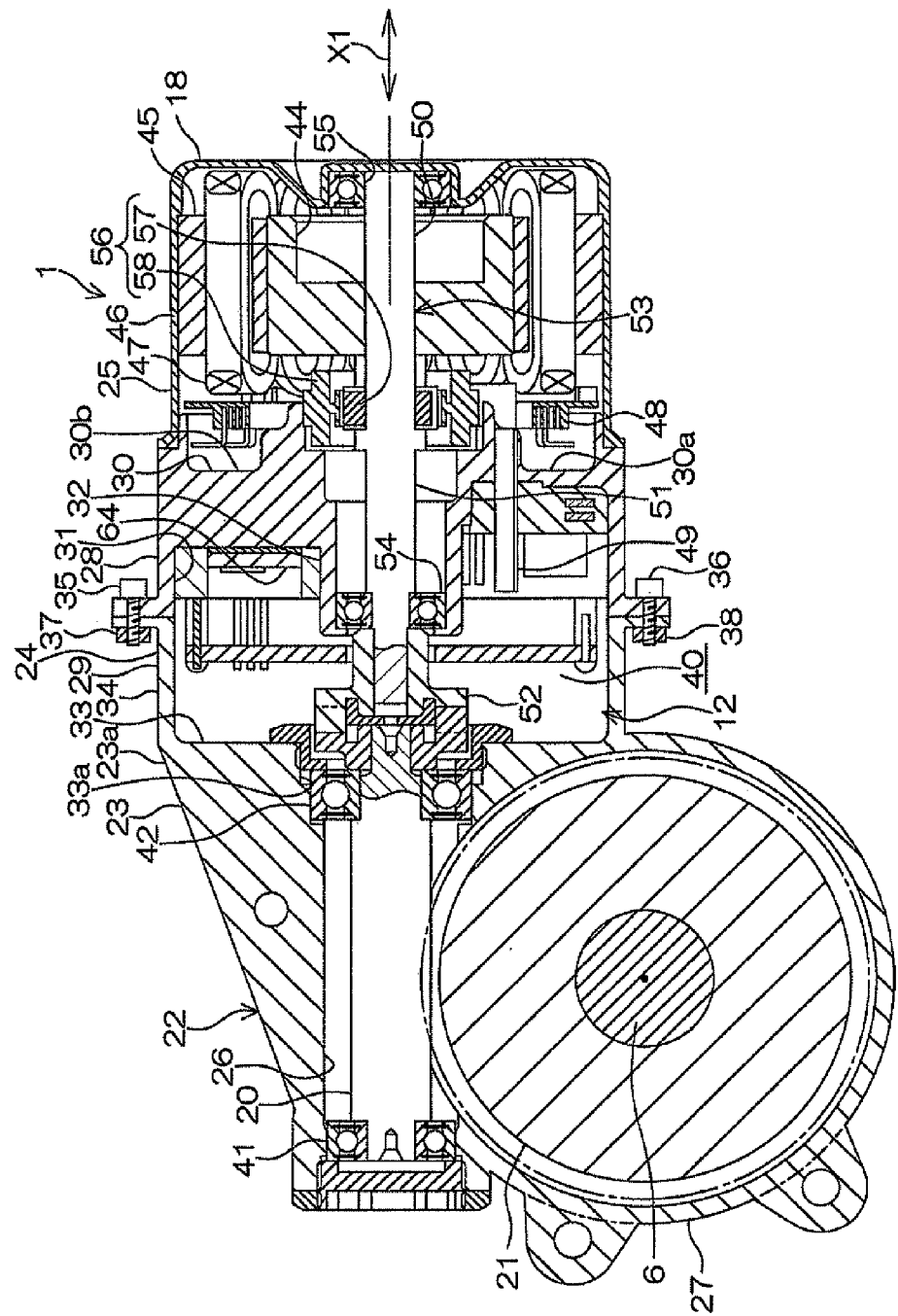
FIG. 2 is a cross-sectional view of a main portion of the electric power steering system.

FIG. 2 is a cross-sectional view of a main portion of the electric power steering system 1. As shown in FIG. 2, the electric power steering system 1 includes a housing 22. The housing 22 has the gear housing 23, an ECU housing 24 and a motor housing 25. The gear housing 23 is a single-piece molded product that is made of an aluminum alloy, or the like. The gear housing 23 has a cylindrical drive gear accommodating portion 26 and a driven gear accommodating portion 27. The drive gear accommodating portion 26 accommodates the worm shaft 20 that serves as the drive gear. The driven gear accommodating portion 27 accommodates the worm wheel 21 that serves as the driven gear.

The worm shaft 20 of the speed reduction mechanism 19 is supported at both ends by the drive gear accommodating portion 26 via a first bearing 41 and a second bearing 42. The ECU housing 24 is arranged between the gear housing 23 and the motor housing 25 of the electric motor 18. The ECU housing 24 has a first housing 28 and a second housing 29.

The first housing 28 serves as a retaining member. The second housing 29 is integrally formed with the gear housing 23, and made of the same material as that of the gear housing 23. The first housing 28 is arranged next to the motor housing 25. The first housing 28 is a single-piece molded product, and has a plate-like bottom wall 30, a peripheral wall 31 and a cylindrical portion 32. The bottom wall 30 has a hole at its center. The peripheral wall 31 extends from the outer periphery of the bottom wall 30. The cylindrical portion 32 extends from the inner periphery of the bottom wall 30.

The bottom wall 30 has a thin wall portion 30a and a thick wall portion 30b that is thicker than the thin wall portion 30a. The thick wall portion 30b is provided as a heat dissipation portion on which a power board 64 (described later) is installed. Heat from the power board 64 is dissipated outside the first housing 28 through the thick wall portion 30b. The peripheral wall 31 is formed in, for example, a ring shape having a rectangular cross section, and extends from the bottom wall 30 toward the second housing 29. The cylindrical portion 32 is formed in a cylindrical shape, and extends from the bottom wall 30 toward the second housing 29.

The second housing 29 is arranged at one end portion 23a of the gear housing 23. The second housing 29 has a bottom surface 33 and a peripheral wall 34. The bottom surface 33 has a hole 33a at its center. The peripheral wall 34 extends from the outer periphery of the bottom surface 33. The peripheral wall 34 is formed in a shape similar to (in the present embodiment, a ring shape having a rectangular cross section) that of the peripheral wall 31. An end of the peripheral wall 34 and an end of the peripheral wall 31 are fastened to each other using fixing screws 35 and 36 and fixing nuts 37 and 38. The first housing 28 and the second housing 29 are fastened to each other to form an accommodating chamber 40. The accommodating chamber 40 accommodates the ECU 12 that serves as the control device.

The motor housing 25 of the electric motor 18 is formed in a cylindrical shape having a bottom at one end. The other end of the motor housing 25 is fixed to the first housing 28 of the ECU housing 24. The electric motor 18 is a brushless motor. The electric motor 18 includes a rotor 44 and a stator 45 that are accommodated in the motor housing 25.

The stator 45 is fixed to the inner periphery of the motor housing 25. The stator 45 has a stator core 46 and a plurality of coils 47. The stator core 46 is fixed to the inner periphery of the motor housing 25. The stator core 46 has an annular yoke and a plurality of teeth that protrude radially inward from the inner periphery of the yoke. The coils 47 are wound around the corresponding teeth. In addition, a first motor bus bar 48 is accommodated in the motor housing 25. The first motor bus bar 48 has an annular shape or a C shape. The coils 47 wound around the teeth are connected to the first motor bus bar 48.

The first motor bus bar 48 is connected to a second motor bus bar 49. The second motor bus bar 49 extends substantially linearly, and passes through the thin wall portion 30a of the first housing 28. One end of the second motor bus bar 49 is fixed to the first motor bus bar 48 by soldering, welding, or the like. The rotor 44 is an annular member that includes a rotor magnet, and is coupled to an output shaft 50 of the electric motor 18 so as to be rotatable together with the output shaft 50. The output shaft 50 is integrally formed with a coupling shaft 51, and made of the same material as that of the coupling shaft 51. The coupling shaft 51 is coupled to the worm shaft 20 via a joint 52 such that power is transmittable. The coupling shaft 51 and the output shaft 50 form a shaft unit 53. One end of the shaft unit 53 is rotatably supported by the cylindrical portion 32 via a third bearing 54. The other end of the shaft unit 53 is rotatably supported by the motor housing 25 via a fourth bearing 55.

Figure 3:
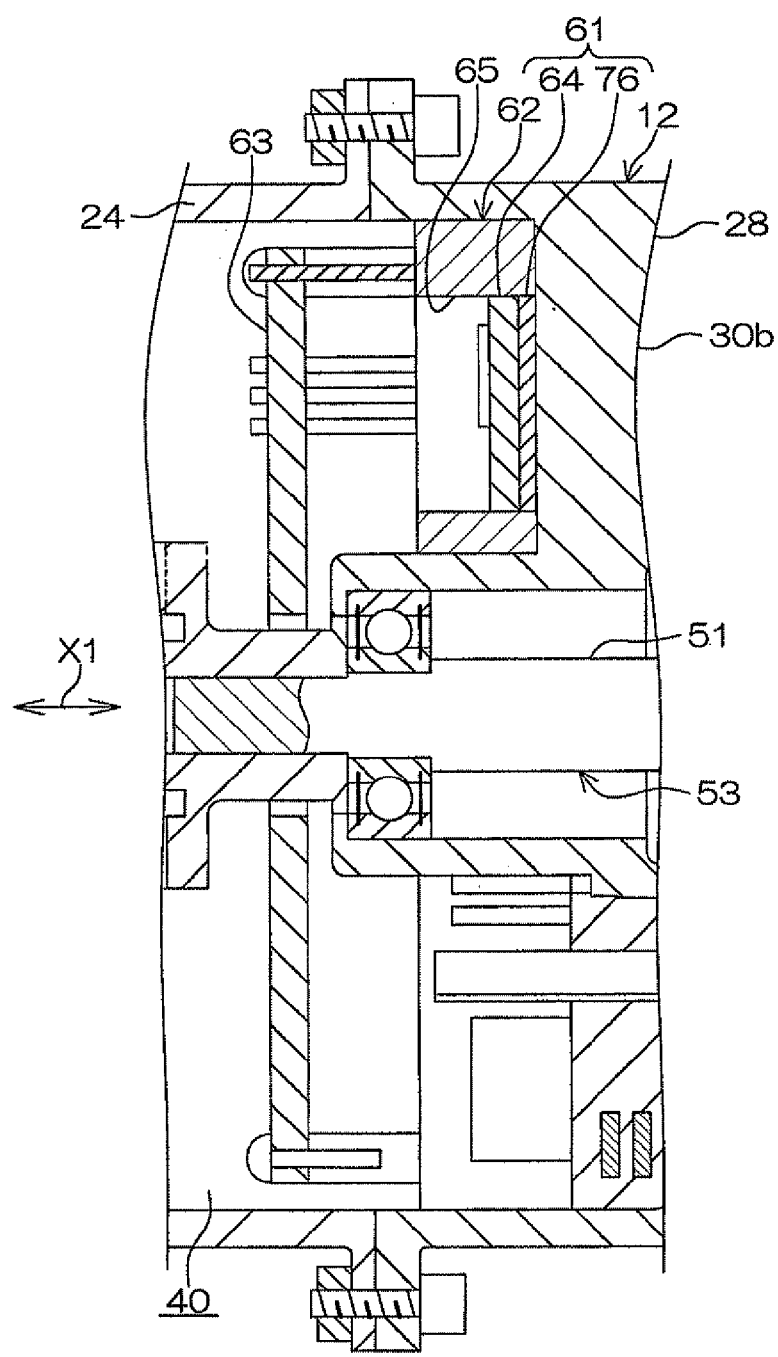
FIG. 3 is an enlarged view of a portion near an ECU shown in FIG. 2.

A resolver 56 is provided at the output shaft 50. The resolver 56 serves as a sensor for detecting a rotational position of the electric motor 18. The resolver 56 includes a resolver rotor 57 and a resolver stator 58. The resolver rotor 57 is coupled to the output shaft 50 so as to be rotatable together with the output shaft 50. The resolver stator 58 surrounds the resolver rotor 57. The resolver stator 58 is held on the inner periphery of the first housing 28. FIG. 3 is an enlarged view of a portion near the ECU 12 shown in FIG. 2. As shown in FIG. 3, the ECU 12 includes the ECU housing 24, a circuit board unit 61, a power module 62 and a control board (board) 63. The ECU housing 24 serves as a casing. The control board 63 includes a CPU, and the like. The circuit board unit 61, the power module 62 and the control board 63 are accommodated in the accommodating chamber 40 of the ECU housing 24.

The circuit board unit 61 is arranged on the thick wall portion 30b of the bottom wail 30, and includes the power board 64 that serves as a driving circuit board of the electric motor 18. The power board 64 is controlled by the control board 63. The power module 62 is provided so as to transmit electric power from a battery (not shown) of a vehicle to the power board 64. The battery is arranged outside the ECU housing 24.

The power module 62 is a molded product in which a plurality of components associated with supply of electric power to the power board 64 is integrally held.

Figure 4:
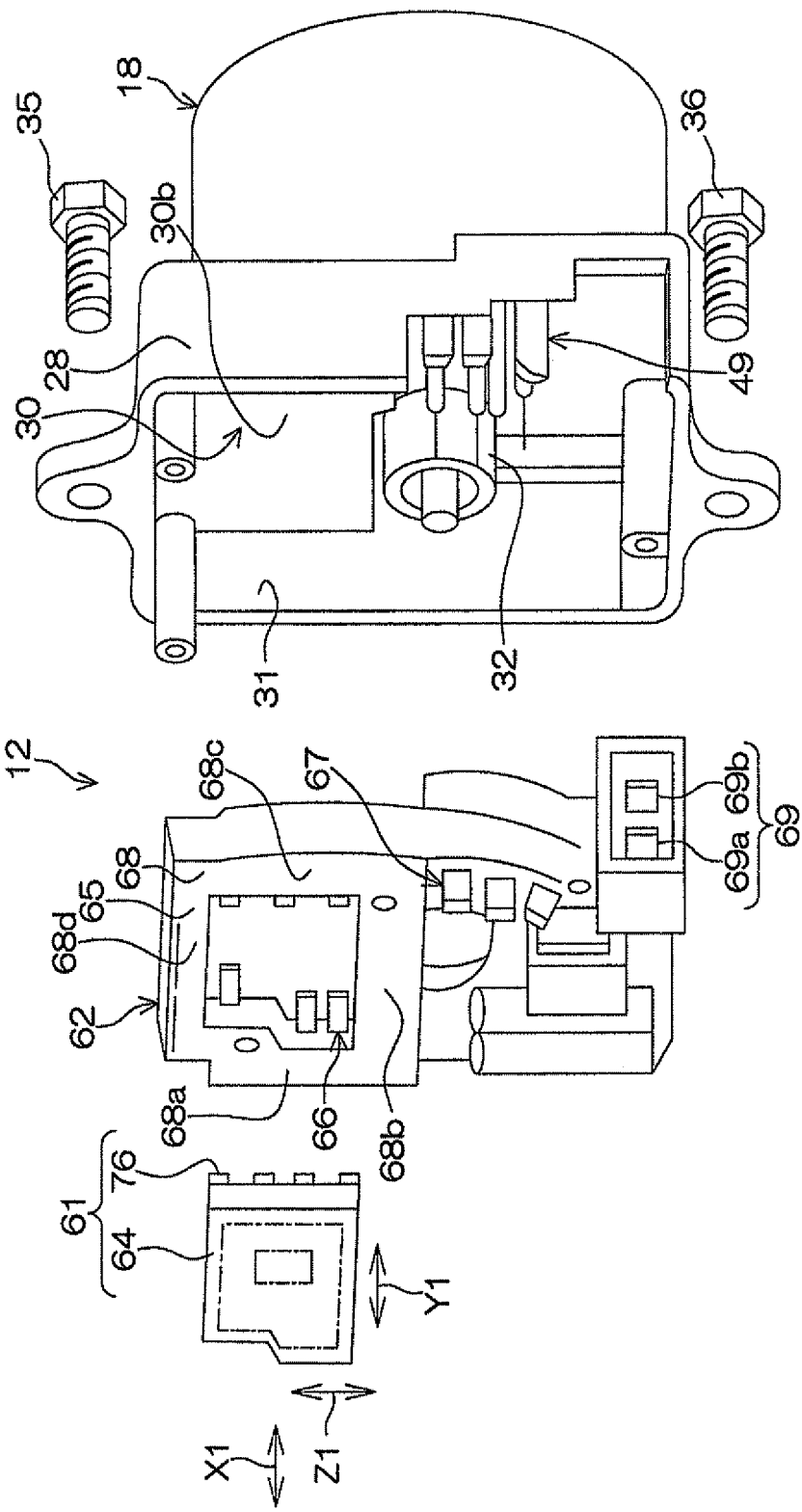
FIG. 4 is a schematic exploded perspective view of a main portion near the ECU.

FIG. 4 is a schematic exploded perspective view of a main portion near the ECU 12. As shown in FIG. 4, the power module 62 includes a main portion 65, conductive power bus bars 66 and conductive third motor bus bars 67. The power bus bars 66 and the third motor bus bars 67 serve as connecting members held by the main portion 65. The main portion 65 is a single-piece molded product made of synthetic resin, and is an electrically insulating member. The main portion 65 is formed in an annular shape (frame shape) so as to surround the cylindrical portion 32, and is formed along the peripheral wall 31. The main portion 65 is formed along the bottom wall 30 of the first housing 28, and is fixed to the bottom wall 30 using fixing screws (not shown).

The main portion 65 has a frame portion 68 that surrounds the power board 64 when viewed in the axial direction X1 of the shaft unit 53. The frame portion 68 is formed in a rectangular shape in a plain view, and has a first side portion 68a, a second side portion 68b, a third side portion 68c and a fourth side portion 68d. The first side portion 68a and the third side portion 68c extend in the lateral direction Z1 of the power board 64. The second side portion 68b and the fourth side portion 68d extend in the longitudinal direction Y1 of the power board 64.

Figure 5:
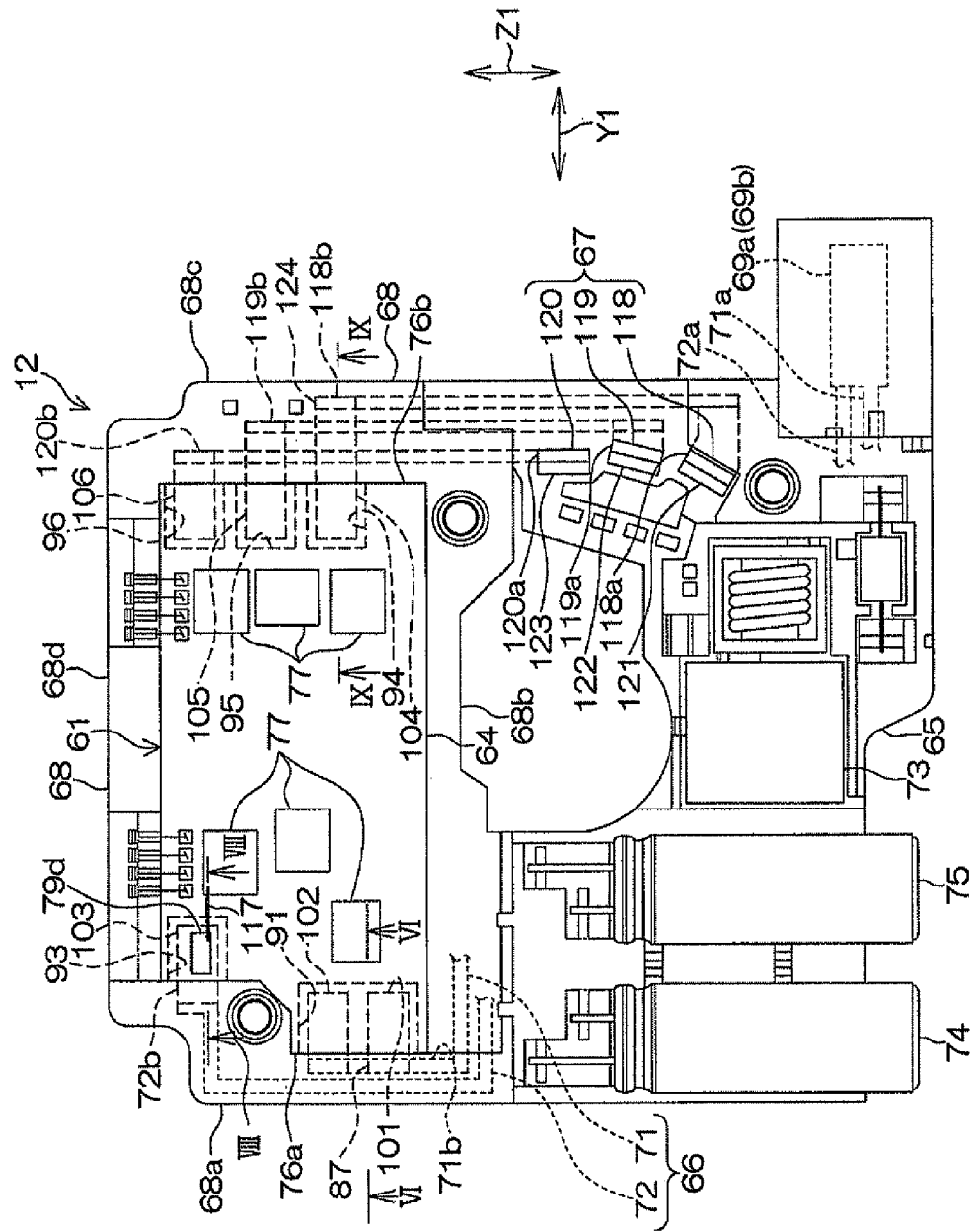
FIG. 5 is a plain view of a main portion of the ECU.

The main portion 65 includes a power connector 69 and the power bus bars 66. The power connector 69 has a pair of terminals 69a and 69b. The terminal 69a is connected to a positive electrode of the battery (not shown) of the vehicle. The terminal 69b is grounded to a vehicle body. FIG. 5 is a plain view of a main portion of the ECU 12. As shown in FIG. 5, the power bus bars 66 include a first power bus bar 71 and a second power bus bar 72. The first power bus bar 71 and the second power bus bar 72 are each formed of a metal member used as a conductive member, and formed in a strip shape as a whole. The most part of each of the first power bus bar 71 and the second power bus bar 72 is embedded in the main portion 65.

One end portion 71a of the first power bus bar 71 is connected to the terminal 69a. In addition, a relay 73 is connected to an intermediate portion of the first power bus bar 71. Current flowing to the electric motor may be interrupted as needed by operating the relay 73. One end portion 72a of the second power bus bar 72 is connected to the terminal 69b. Two capacitors 74 and 75 are connected to an intermediate portion of the first power bus bar 71 and an intermediate portion of the second power bus bar 72. These capacitors 74 and 75 are provided so as to remove a ripple of current flowing to the electric motor 18. The capacitors 74 and 75 and the relay 73 are held by the main portion 65. The other end portion 71b of the first power bus bar 71 and the other end portion 72b of the second power bus bar 72 both are connected to the power board 64 of the circuit board unit 61.

Figure 6:
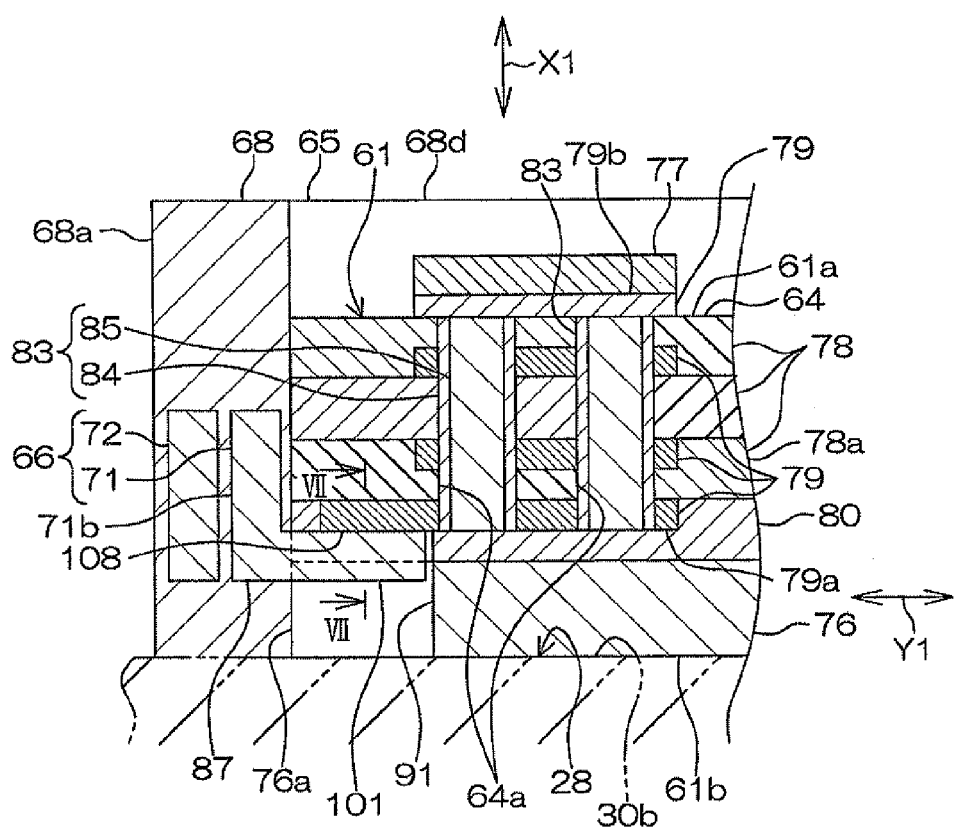
FIG. 6 is a sectional view taken along the line VI-VI in FIG. 5.

FIG. 6 is a sectional view taken along the line VI-VI in FIG. 5. As shown in FIG. 5 and FIG. 6, the circuit board unit 61 includes the power board 64, a heat dissipation plate 76 and semiconductor elements 77. The heat dissipation plate 76 serves as a heat sink made of, for example, an aluminum plate fixed to the lower surface of the power board 64. The semiconductor elements 77 are installed on the upper surface of the power board 64. The semiconductor elements 77 are, for example, field effect transistors (FET) that serve as switching elements.

As shown in FIG. 6, the power board 64 is a multilayer circuit board in which multiple insulating layers 78 are laminated on top of each other and a conductive layer 79 is arranged between the consecutive insulating layers 78. A lowermost insulating layer 78a is joined to an electrically insulating bonding layer (insulating layer) 80. The conductive layer 79 is also arranged between the lowermost insulating layer 78a and the bonding layer 80. The bonding layer 80 is fixed to the lowermost insulating layer 78a, a conductive layer 79a and the heat dissipation plate 76.

The heat dissipation plate 76 is arranged on the thick wall portion 30b. The lower surface of the heat dissipation plate 76 is a lower surface 61b of the circuit board unit 61, and is in surface contact with the thick wall portion 30b of the first housing 28. Thus, heat transferred from the semiconductor elements 77 to the heat dissipation plate 76 is transferred to the thick wall portion 30b and is radiated outside the ECU housing 24. An upper surface of the power board 64, which serves as an installation surface, is an upper surface 61a of the circuit board unit 61. The upper surface 61a is on the opposite side of the circuit board unit 61 from the lower surface 61b in the axial direction X1. A conductive layer 79b is formed on the upper surface 61a. The semiconductor elements 77 that serve as electrical elements are connected to the conductive layer 79b using a soldering member. In this way, the semiconductor elements 77 are installed in a bare chip state.

For example, six semiconductor elements 77 are installed on the upper surface 61a of the power board 64 (in FIG. 6, only one semiconductor element 77 is illustrated). These semiconductor elements 77, and the like, form a power circuit for driving the electric motor 18. The multiple conductive layers 79 are electrically connected through vias 83, each of which extends in the thickness direction of the power board 64. For example, two vias 83 are provided, and are respectively arranged inside hole portions 64a formed in the power board 64. Each of the vias 83 has a plated layer 84 and a filling member 85. The plated layer 84 is formed on the inner peripheral surface of the hole portion 64a. The filling member 85 is placed on the inner side of the plated layer 84. The plated layer 84 is formed of, for example, copper plating, and is connected to the plurality of conductive layers 79. The filling member 85 is formed by hardening metal paste, synthetic resin, or the like. Heat from the semiconductor elements 77 is easily dissipated to the heat dissipation plate 76 owing to the vias 83.

The first power bus bar 71 is connected to the power board 64. Specifically, the lower surface 61*b* of the heat dissipation plate 76 of the power board 64 has a cutout portion 91. The other end portion 71*b* of the first power bus bar 71 is arranged next to the cutout portion 91. As shown in FIG. 5 and FIG. 6, the other end portion 71*b* of the first power bus bar 71 has an embedded portion 87 and protruding pieces 101 and 102. The embedded portion 87 is embedded in and held by the first side portion 68*a* of the frame portion 68. The protruding pieces 101 and 102 serve as supporting portions, and extend, from the embedded portion 87, in the cutout portion 91. The protruding pieces 101 and 102 each linearly extend in parallel with the longitudinal direction Y1 of the power board 64, and have a rectangular shape in a plain view. The protruding piece 101 is arranged at a position close to the lower end (one side in the axial direction X1) of the first side portion 68*a* and near the boundary portion between the first side portion 68*a* and the second side portion 68*b*. The protruding pieces 101 and 102 are arranged side by side with a gap left therebetween in the lateral direction Z1 of the power board 64.

The cutout portion 91 of the power board 64 is formed in a first side surface 76*a* of the heat dissipation plate 76, facing the first side portion 68*a*. The cutout portion 91 extends through the heat dissipation plate 76 in the thickness direction (axial direction X1). The protruding pieces 101 and 102 are inserted in the cutout portion 91.

Figure 7:
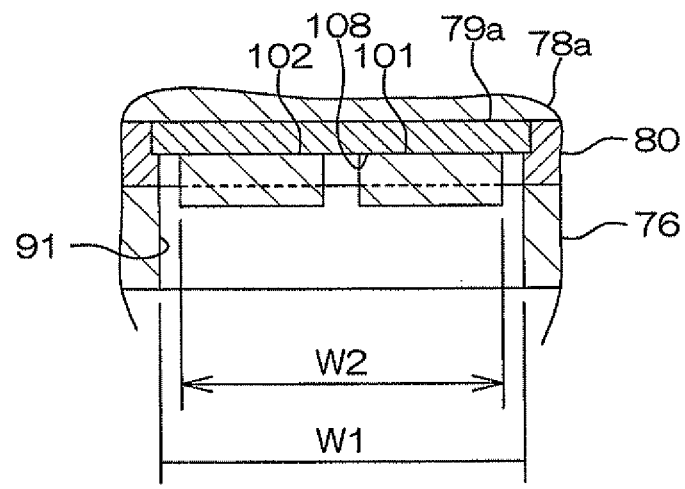
FIG. 7 is a sectional view taken along the line VII-VII in FIG. 6.

As shown in FIG. 7 that is a sectional view taken along the line VII-VII in FIG. 6, the width W1 of the cutout portion 91 is larger than the width W2 including the widths of the protruding pieces 101 and 102 and the gap therebetween. This prevents a short circuit due to contact of the protruding piece 101 or 102 with the heat dissipation plate 76.

As shown in FIG. 5 and FIG. 6, the protruding pieces 101 and 102 are fixed by a soldering member, or the like, to a positive terminal 108 formed in the lowermost conductive layer 79*a*. Thus, the protruding pieces 101 and 102 support the power board 64, The plated layer 84 of each via 83 is connected to the positive terminal 108 and a conductive layer 79*b* formed on the upper surface 61*a* of the power board 64. The conductive layer 79*b* is connected to the drain electrode of a corresponding one of the semiconductor elements 77. Thus, the protruding pieces 101 and 102 are electrically connected to the drain electrodes of the semiconductor elements 77 through the vias 83. In addition, heat from the semiconductor elements 77 are easily dissipated to the protruding pieces 101 and 102 and the heat dissipation plate 76 owing to the vias 83. Note that the protruding piece 102 may be omitted.

Figure 8:
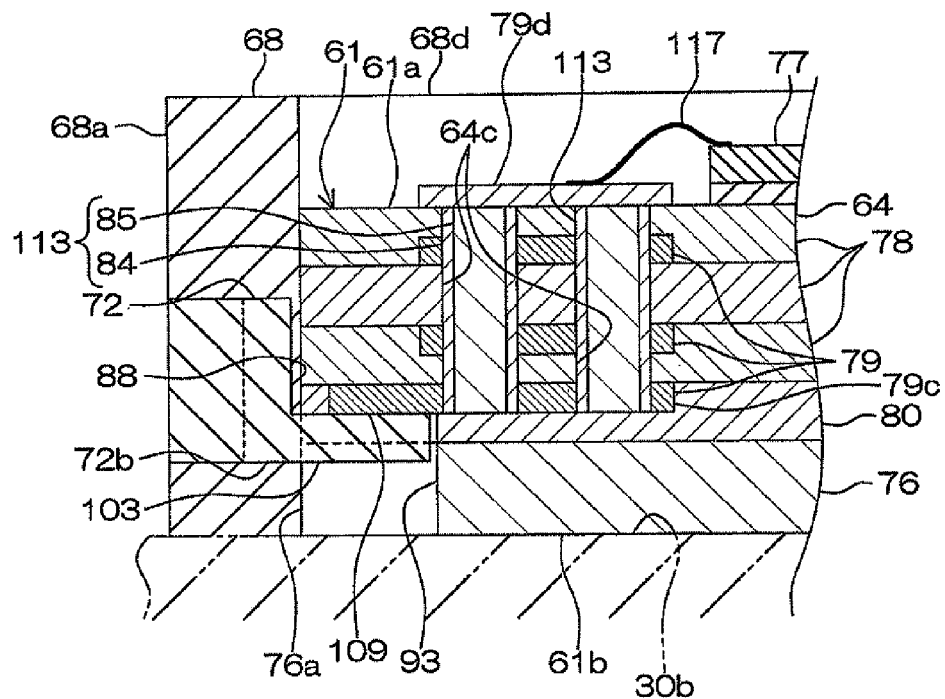
FIG. 8 is a sectional view taken long the line VIII-VIII in FIG. 5.

FIG. 8 is a sectional view taken along the line VIII-VIII in FIG. 5. As shown in FIG. 5 and FIG. 8, the second power bus bar 72 is connected to the power board 64. Specifically, a cutout portion 93 is formed in the lower surface 61*b* of the heat dissipation plate 76 of the power board 64. The other end portion 72*b* of the second power bus bar 72 is arranged next to the cutout portion 93. The other end portion 72*b* of the second power bus bar 72 has an embedded portion 88 and a protruding piece 103. The embedded portion 88 is embedded in and held by the first side portion 68*a*. The protruding piece 103 serves as a supporting portion, and extends, from the embedded portion 88, in the frame portion 68. The protruding piece 103 is formed in a shape similar to that of the protruding piece 101. The protruding piece 103 is arranged at a position close to the lower end of the first side portion 68*a* and near the boundary portion between the first side portion 68*a* and the fourth side portion 68*d*. The protruding piece 103 and the protruding piece 102 are arranged side by side with a gap left therebetween in the lateral direction Z1.

The cutout portion 93 of the power board 64 is formed in the first side surface 76*a* of the heat dissipation plate 76. The cutout portion 93 extends through the heat dissipation plate 76 in the thickness direction (axial direction X1). The protruding piece 103 is inserted in the cutout portion 93. The width of the cutout portion 93 is larger than the width of the protruding piece 103. This prevents a short circuit due to contact of the protruding piece 103 with the heat dissipation plate 76. The protruding piece 103 is fixed by a soldering member, or the like, to a negative terminal 109 formed in a lowermost conductive layer 79*c*. Thus, the protruding piece 103 supports the power board 64.

Vias 113 are connected to the negative terminal 109. Each of the vias 113 has a plated layer 84 and a filling member 85. Those are arranged in, for example, a corresponding hole portion 64*c* formed in the power board 64. The plated layer 84 of each via 113 is connected to the negative terminal 109 and a conductive layer 79*d* formed on the upper surface 61*a* of the power board 64. The conductive layer 79*d* is connected to the source electrode of a corresponding one of the semiconductor elements 77 via a bonding wire 117. Thus, the protruding piece 103 is connected to the source electrodes of the semiconductor elements 77 through the vias 113 and the bonding wires 117. In addition, heat from the semiconductor elements 77 are easily dissipated to the protruding piece 106 and the heat dissipation plate 76 owing to the vias 113.

As shown in FIG. 5, the most part of each of the third motor bus bars 67 is embedded in the main portion 65, and the third motor bus bars 67 include a U-phase bus bar 118, a V-phase bus bar 119 and a W-phase bus bar 120. One end portion 118*a* of the U-phase bus bar 118, one end portion 119*a* of the V-phase bus bar 119 and one end portion 120*a* of the W-phase bus bar 120 are connected to a U-phase bus bar 121, a V-phase bus bar 122 and a W-phase bus bar 123 of the second motor bus bar 49, respectively.

Figure 9:
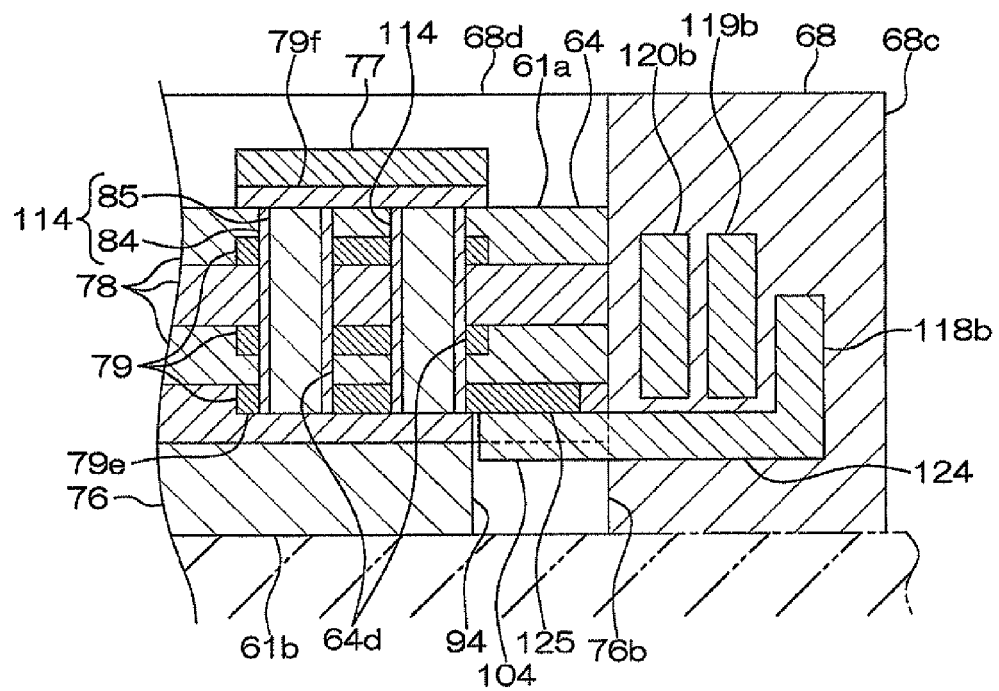
FIG. 9 is a sectional view taken along the line IX-IX in FIG. 5.

The other end portion 118*h* of the U-phase bus bar 118, the other end portion 119*b* of the V-phase bus bar 119 and the other end portion 120*b* of the W-phase bus bar 120 of the third motor bus bars 67 are connected to the power board 64. With reference to FIG. 5 and FIG. 9 that is a sectional view taken along the line IX-IX in FIG. 5, first, connection between the other end portion 118*b* of the U-phase bus bar 118 and the power board 64 will be described. A cutout portion 94 is formed in the lower surface 61*b* of the heat dissipation plate 76 of the power board 64, and the other end portion 118*b* of the U-phase bus bar 118 is arranged next to the cutout portion 94.

The other end portion 118*b* of the U-phase bus bar 118 has an embedded portion 124 and a protruding piece 104. The embedded portion 124 is embedded in the third side portion 68*c* of the frame portion 68. The protruding piece 104 extends, from the embedded portion 124, in the cutout portion 94. The protruding piece 104 is formed in a shape similar to that of the protruding piece 101. The protruding piece 104 is arranged at a position close to the lower end of the third side portion 68*c* and near the boundary portion between the third side portion 68*c* and the second side portion 68*b*. The protruding piece 104 is arranged so as to face the protruding pieces 101 and 102 in the longitudinal direction Y1.

The cutout portion 94 of the power board 64 is formed in a second side surface 76*b* of the heat dissipation plate 76. The cutout portion 94 extends through the heat dissipation plate 76 in the thickness direction (axial direction Xi). The protruding piece 104 is inserted in the cutout portion 94. The width of the cutout portion 94 is larger than the width of the protruding piece 104. This prevents a short circuit due to contact of the protruding piece 104 with the heat dissipation plate 76. The protruding piece 104 is fixed by a soldering member, or the like, to a U-phase terminal 125 formed in a lowermost conductive layer 79e. Thus, the protruding piece 104 supports the power board 64.

Vias 114 are connected to the U-phase terminal 125. Each of the vias 114 has a plated layer 84 and a filling member 85. Those are arranged in, for example, a corresponding hole portion 64d formed in the power board 64, The plated layer 84 of each via 114 is connected to the U-phase terminal 125 and a conductive layer 79f of the upper surface 61a of the power board 64. The conductive layer 79f is connected to a corresponding one of the semiconductor elements 77. Thus, the protruding piece 104 is electrically connected to the corresponding semiconductor elements 77 through the vias 114. Heat from the semiconductor elements 77 are easily dissipated to the protruding piece 104 and the heat dissipation plate 76 owing to the vias 114.

Connection between the other end portion 119b of the V-phase bus bar 119 and the power board 64 will be described with reference to FIG. 5. Specifically, a cutout portion 95 is formed in the heat dissipation plate 76 of the power board 64, and a fifth protruding piece 105 is inserted in the cutout portion 95. The fifth protruding piece 105 serves as a supporting portion for the other end portion 119b of the V-phase bus bar 119. The configuration of connection between the cutout portion 95 and the fifth protruding piece 105 of the V-phase bus bar 119 is similar to the configuration of connection between the cutout portion 94 and the protruding piece 104.

The protruding piece 105 is fixed by a soldering member, or the like, to a V-phase terminal (not shown) formed in the lowermost conductive layer 79. The V-phase terminal is electrically connected to the corresponding semiconductor elements 77 through, for example, vias. Next, connection between the other end portion 120b of the W-phase bus bar 120 and the power board 64 will be described. Specifically, a cutout portion 96 is formed in the heat dissipation plate 76 of the power board 64, and a protruding piece 106 is inserted in the cutout portion 96. The protruding piece 106 serves as a supporting portion for the other end portion 120b of the W-phase bus bar 120. The configuration of connection between the cutout portion 96 and the protruding piece 106 of the W-phase bus bar 120 is similar to the configuration of connection between the cutout portion 94 and the protruding piece 104.

The protruding piece 106 is fixed by a soldering member, or the like, to a W-phase terminal (not shown) formed in the lowermost conductive layer 79, The W-phase terminal is electrically connected to the corresponding semiconductor elements 77 through, for example, vias. The protruding pieces 104, 105 and 106 are arranged at substantially equal intervals in the lateral direction Z1 of the power board 64. The circuit board unit 61 is supported at both ends by the protruding pieces 101 to 106.

Figure 10:
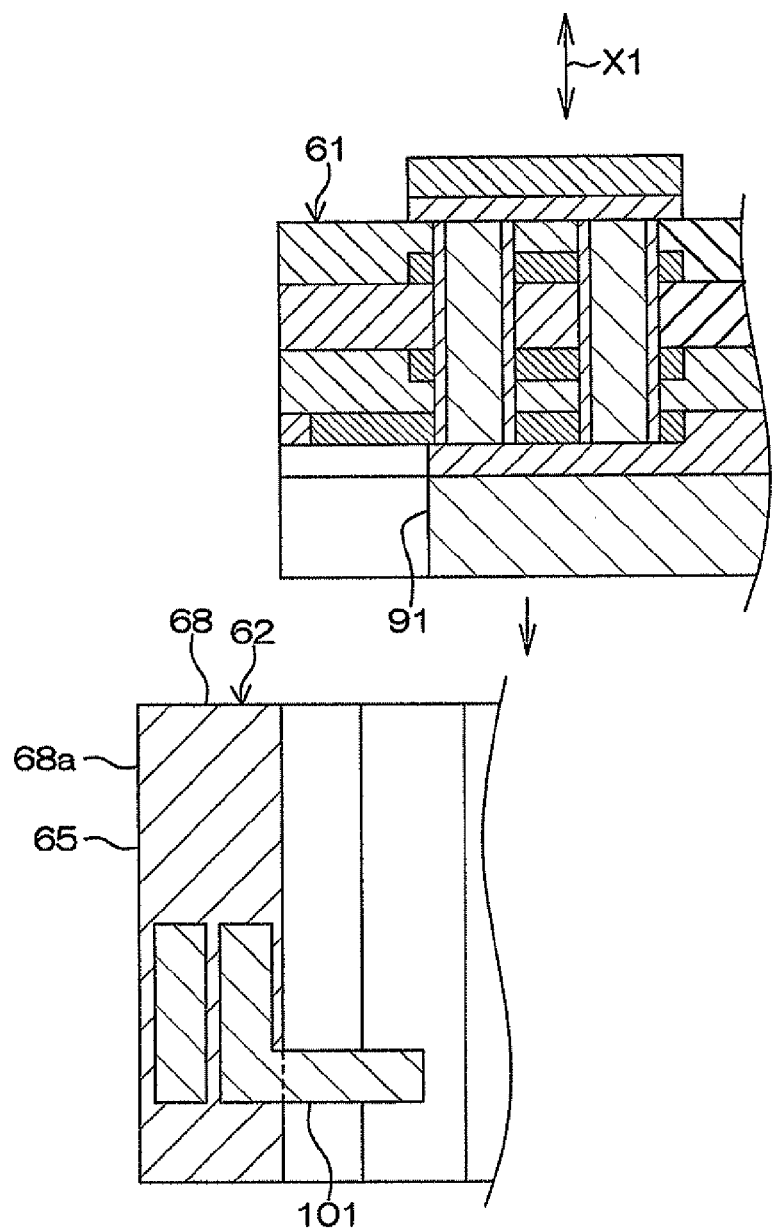
FIG. 10 is a sectional view of a main portion, showing a process of fitting a circuit board unit to a power module.

In the electric power steering system 1 having the above schematic configuration, the circuit board unit 61 is connected to the main portion 65 of the power module 62, for example, as follows. That is, as shown in FIG. 10, first, the circuit board unit 61 is arranged above the main portion 65 of the power module 62. Subsequently, the circuit board unit 61 is lowered into the frame portion 68 of the main portion 65. Thus, as shown in FIG. 5 and FIG. 6, the protruding pieces 101 to 106 are inserted into the corresponding cutout portions 91, 93 to 96. In this state, a soldering iron, or the like, is inserted into each of the cutout portions 91, 93 to 96 to fixedly solder the protruding pieces 101 to 106 to the corresponding terminals of the power board 64.

As described above, according to the present embodiment, the protruding pieces 101 to 106 are inserted in the corresponding cutout portions 91, 93 to 96 of the circuit board unit 61. Thus, it is not necessary to set space for the protruding pieces 101 to 106 on the upper surface 61a of the circuit board unit 61. Thus, larger installation space for the semiconductor elements 77 may be ensured on the upper surface 61a of the circuit board unit 61. In addition, the protruding pieces 101 to 106 are arranged inside the circuit board unit 61, so the thickness of the circuit board unit 61 is suppressed. Thus, it is possible to suppress an increase in the size of the ECU 12.

In addition, the cutout portions 91, 93 to 96 are formed by cutting out the lower surface 61 b of the circuit board unit 61, and are open at the lower surface 61 b. Thus, work for fixing the protruding pieces 101 to 106 to the circuit board unit 61 is easily carried out. For example, the protruding pieces 101 to 106 may be inserted in the corresponding cutout portions 91, 93 to 96 by a simple method in which the circuit board unit 61 is placed on the protruding pieces 101 to 106. As a result, the protruding pieces 101 to 106 and the circuit board unit 61 are reliably and firmly fixed to each other. In addition, the cutout portions 91, 93 to 96 are formed with a simple configuration in which the lower surface 61b of the circuit board unit 61 is cut out.

Figure 11A:
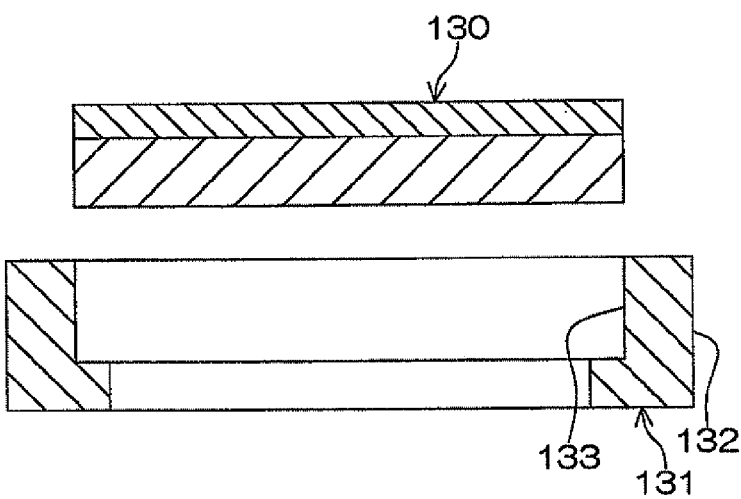
FIG. 11A to FIG. 11C are views for illustrating a comparative example.
Figure 11B:
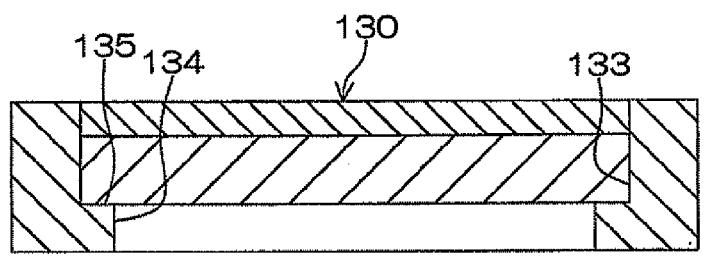
Figure 11C:
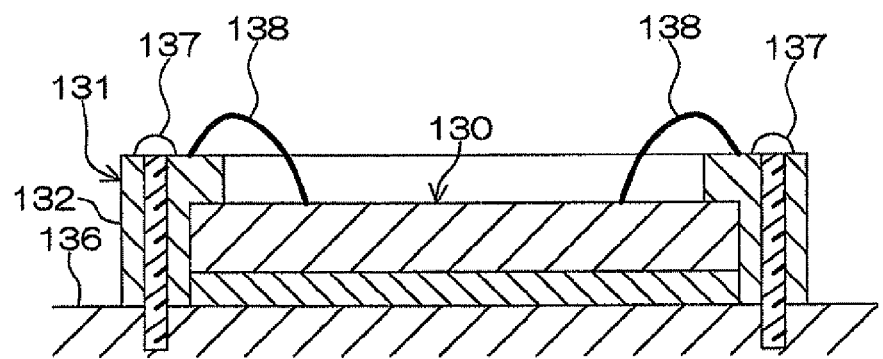

For example, the case where the circuit board unit is connected to the power module using the bonding wires is assumed. In this case, as shown in FIG. 11 A, first, in a state where both a circuit board unit 130 and a main portion 132 of a power module 131 are placed upside down, the circuit board unit 130 is inserted into a frame portion 133 of the main portion 132 of the power module 131. Thus, as shown in FIG. 11B, the circuit board unit 130 is brought into contact with a protruding portion 135 of an edge 134 of the frame portion 133. In this state, as shown in FIG. 11C, the circuit board unit 130 and the main portion 132 of the power module 131 are turned upside down, and are placed on a jig 136. Then, these circuit board unit 130 and main portion 132 are fixed to the jig 136 using fixing screws 137. In this state, bonding wires 138 are joined to the circuit board unit 130 and pads (not shown) of the power module 131. After that, the fixing screws 137 are removed, and then the circuit board unit 130 and the power module 131 are fixed to the first housing 28.

In the case of the configuration shown in FIG. 11 A to FIG. 11 C, a process of turning the circuit board unit 130 and the main portion 132 of the power module 131 upside down, a process of temporarily fixing the main portion 132 of the power module 131, and the like, to the jig 136, a process of canceling the temporary fixing, and the like, are required. Therefore, the work is cumbersome. In contrast to this, according to the present embodiment, a process of turning the circuit board unit 130 and the main portion 132 of the power module 131 upside down, a process of temporarily fixing the main portion 132 of the power module 131, and the like, to the jig 136, a process of canceling the temporary fixing, and the like, are not required. Therefore, the work of producing the ECU 12 is less cumbersome.

In addition, the protruding pieces 101 to 106 are electrically connected to the semiconductor elements 77 using the vias 83, 113 and 114. Moreover, heat generated while the semiconductor elements 77 are driven are dissipated through the vias 83, 113 and 114 toward the lower surface 61b of the circuit board unit 61. Thus, heat generated by the semiconductor elements 77 is effectively dissipated to the heat dissipation plate 76 and the thick wall portion 30b.

Furthermore, no cutout portion is provided in the power board 64 that is the multilayer circuit board, so the area for each conductive layer 79 in the power board 64 does not reduce. Thus, a required circuit is formed on the power board 64 without increasing the size of the power board 64. In addition, the protruding pieces 101 to 106 are used as transfer paths for heat from the semiconductor elements 77 to the heat dissipation plate 76. Thus, heat generated by the semiconductor elements 77 are further effectively dissipated to the heat dissipation plate 76.

In addition, the first housing 28 has the thick wall portion 30b for dissipating heat from the heat dissipation plate 76. Thus, heat from the heat dissipation plate 76 is dissipated outside the first housing 28 through the thick wall portion 30b. Thus, the circuit board unit 61 and the power module 62 are accommodated in the ECU housing 24, and heat generated by the semiconductor elements 77 are effectively dissipated.

In addition, the protruding pieces 101 to 106 are metal members and have an excellent heat dissipation property. Thus, even if the cutout portions 91, 93 to 96 are provided in the heat dissipation plate 76, the protruding pieces 101 to 106 are arranged in the cutout portions, so these protruding pieces 101 to 106 function as heat dissipation members like the heat dissipation plate 76. Thus, it is possible to prevent a substantial decrease in heat dissipation performance resulting from the provision of the cutout portions 91, 93 to 96.

The invention is not limited to the details of the above described embodiment, and various modifications may be made within the scope of the appended claims. For example, the semiconductor elements 77 are illustrated as electrical elements installed on the upper surface 61 a of the circuit board unit 61; instead, other electrical elements, such as diodes, may be used. Furthermore, the power board 64 is not limited to a multilayer circuit board; it may be a single-layer circuit board. In addition, the cutout portions 91, 93 to 96 are open at the lower surface 61b of the circuit board unit 61; however, the cutout portions 91, 93 to 96 are not limited to this configuration. Cutout portions just need to be located below the upper surface 61 a of the circuit board unit 61. Furthermore, the cutout portions 91, 93 to 96 are open at the side surface 76a or 76b of the heat dissipation plate 76; however, the cutout portions 91, 93 to 96 are not limited to this configuration. Cutout portions may be open at only the lower surface 61 b of the circuit board unit 61.

The protruding pieces 101 and 102 are arranged in the cutout portion 91; however, the locations of the protruding pieces 101 and 102 are not limited to these locations. Cutout portions respectively corresponding to the protruding pieces 101 and 102 may be provided in the heat dissipation plate 76 and these protruding pieces 101 and 102 are separately arranged in the cutout portion.

What is claimed is:

1. A control device comprising:
   a circuit board unit that has an upper surface on which an electrical element is installed, a lower surface that is on an opposite side of the circuit board unit from the upper surface, and a cutout portion that is formed below the upper surface; and
   a module that includes a conductive connecting member having a supporting portion and an electrically insulating main portion that holds the connecting member, the supporting portion being inserted in the cutout portion to support the circuit board unit and being electrically connected to the electrical element.

2. The control device according to claim 1, wherein the cutout portion is formed by cutting out the lower surface of the circuit board unit.

3. The control device according to claim 1, wherein:
   the circuit board unit includes a multilayer circuit board in which a conductive layer is arranged between multiple laminated insulating layers, a heat dissipation plate that is fixed to a lowermost layer of the multilayer circuit board and that constitutes the lower surface, and a via that is used to electrically connect the electrical element to the supporting portion; and
   the cutout portion is formed in the heat dissipation plate.

4. The control device according to claim 3, further comprising:
   a casing that accommodates the circuit board unit and the module, wherein
   the casing includes a heat dissipation portion that is in contact with the lower surface, and that is used to dissipate heat from the heat dissipation plate.

5. The control device according to claim 2, wherein:
   the circuit board unit includes a multilayer circuit board in which a conductive layer is arranged between multiple laminated insulating layers, a heat dissipation plate that is fixed to a lowermost layer of the multilayer circuit board and that constitutes the lower surface, and a via that is used to electrically connect the electrical element to the supporting portion; and
   the cutout portion is formed in the heat dissipation plate.

* * * * *